United States Patent
Lu et al.

(10) Patent No.: US 9,553,043 B2
(45) Date of Patent: Jan. 24, 2017

(54) INTERCONNECT STRUCTURE HAVING SMALLER TRANSITION LAYER VIA

(75) Inventors: Lee-Chung Lu, Taipei (TW); Wen-Hao Chen, Hsinchu (TW); Yuan-Te Hou, Hsinchu (TW); Fang-Yu Fan, Hukou Township (TW); Yu-Hsiang Kao, Hsinchu (TW); Dian-Hau Chen, Hsinchu (TW); Shyue-Shyh Lin, Zhubei (TW); Chii-Ping Chen, Taichung (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 514 days.

(21) Appl. No.: 13/438,565

(22) Filed: Apr. 3, 2012

(65) Prior Publication Data
US 2013/0256902 A1    Oct. 3, 2013

(51) Int. Cl.
*H01L 23/522* (2006.01)
*H01L 23/528* (2006.01)

(52) U.S. Cl.
CPC ....... *H01L 23/5226* (2013.01); *H01L 23/5283* (2013.01); *H01L 2924/0002* (2013.01)

(58) Field of Classification Search
CPC ............... H01L 23/5226; H01L 23/528; H01L 23/5283; H01L 23/522; H01L 23/52

USPC ............................................ 45/758, 774, 775
See application file for complete search history.

(56) References Cited

U.S. PATENT DOCUMENTS

| | | | | |
|---|---|---|---|---|
| 6,555,911 | B1 * | 4/2003 | Matsubara et al. | 257/758 |
| 7,479,700 | B2 * | 1/2009 | Takewaki et al. | 257/758 |
| 8,299,621 | B2 * | 10/2012 | Oshida | 257/773 |
| 8,581,415 | B2 * | 11/2013 | Hotta et al. | 257/774 |
| 2008/0105947 | A1 * | 5/2008 | Kuzuhara et al. | 257/506 |

FOREIGN PATENT DOCUMENTS

| | | |
|---|---|---|
| CN | 100485919 C | 5/2009 |
| CN | 100559576 C | 11/2009 |

\* cited by examiner

*Primary Examiner* — David Zarneke
(74) *Attorney, Agent, or Firm* — Hauptman Ham, LLP

(57) ABSTRACT

An interconnect structure including a bottom layer over a substrate, where the bottom layer includes at least one bottom layer line and at least one bottom layer via. The interconnect structure further includes a transition layer over the bottom layer, where the transition layer includes at least one transition layer line and at least one transition layer via. The interconnect structure further includes a top layer over the transition layer, where the top layer includes at least one top layer line and at least one top layer via. The at least one transition layer via has a cross sectional area at least 30% less than a cross sectional area of the at least one top layer via.

10 Claims, 4 Drawing Sheets

US 9,553,043 B2

INTERCONNECT STRUCTURE HAVING SMALLER TRANSITION LAYER VIA

BACKGROUND

An interconnect structure acts to transfer signals between elements of an integrated circuit. The interconnect structure is a three-dimensional lattice work of lines and vias separated by a dielectric material over a substrate, with the lines extending substantially in a horizontal direction and the vias are located to provide electrical connection between different layers of lines. A layer comprises a line and the via electrically connected to a surface of the line closest to the substrate. Spacing between adjacent lines on a same layer is called pitch. Layers of the interconnect structure farther from the substrate have a larger pitch, i.e., a greater distance between lines. Because the density of lines farther from the substrate decreases, the size of the lines increases to allow the decreased number of lines to transmit the same voltage.

A layer where the pitch increases is called a transition layer. The transition layer via is larger than a via in one or more layers below the transition layer in order to mechanically support the larger line atop the transition layer via. However, the larger via size reduces the distance between the transition layer via and the line of the layer adjacent to the transition layer closer to the substrate. The decreased distance increases the likelihood of a short circuit between the transition layer via and the line of the layer directly below the transition layer. One way to reduce the chances of a short circuit is to skip the formation of lines in the lattice of the plane below the transition layer on either side of the transition layer via. The absence of the lines requires an increase in size of the device. In some instances, the size is increased by about 12%.

DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are of course, merely examples and are not intended to be limiting.

Figure 1:
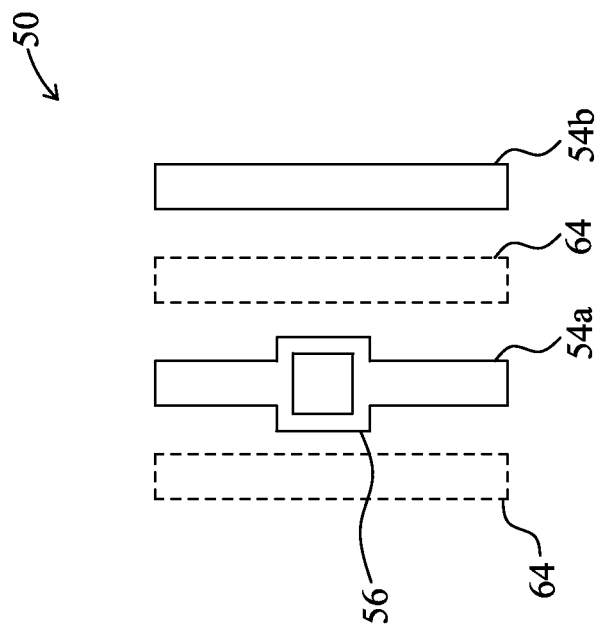
FIG. 1 is a top view of a conventional interconnect structure.

FIG. 1 is a top view of a conventional interconnect structure 50. Interconnect structure 50 includes lines 54a and 54b. A via 56 is electrically connected to a top of line 54a. Unavailable lines 64 are depicted as having a dotted outline. Unavailable lines 64 are locations in a same interconnect level as lines 54a and 54b, where conductive lines cannot be routed due to a proximity of via 56. Unavailable lines 64 are positioned in a periodic relationship between lines 54a and 54b, i.e., a spacing between line 54a and line 64 is substantially equal to a spacing between line 64 and line 54b.

A width of via 56 in relation to a pitch between line 54a and unavailable lines 64 results in an increased likelihood of short circuits forming between via 56 and lines 64. Although via 56 is positioned farther from a substrate than unavailable lines 64, a separation distance between via 56 and unavailable lines 64 is less than a threshold distance to reduce the risk of short circuits. Therefore, to reduce the risk of short circuits, unavailable lines 64 are not formed in interconnect structure 50. The omission of unavailable lines 64 results in a larger chip area to provide the number of lines 54a and 54b necessary to conduct a desired voltage through interconnect structure 50, without causing damage to lines 54a and 54b due to the voltage level conducted by a single line.

Figure 2:
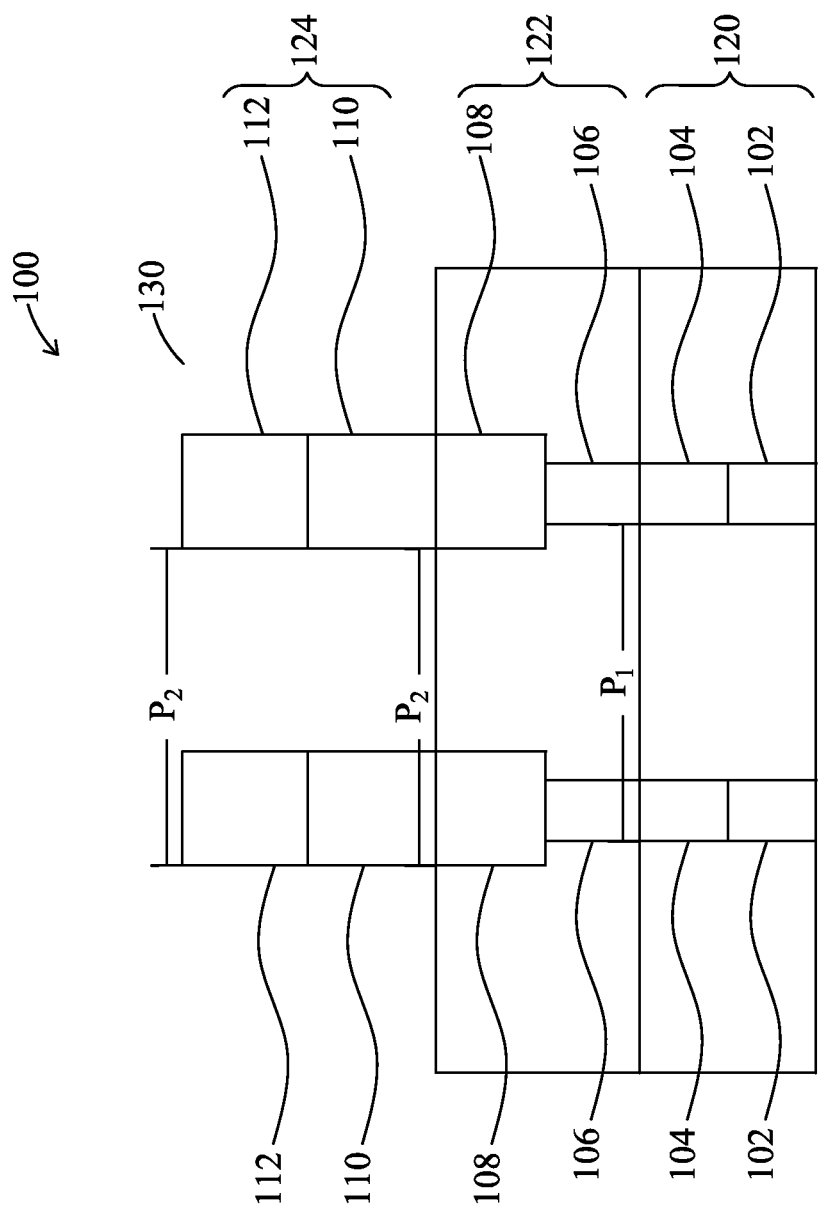
FIG. 2 is a side view of an interconnect structure for an integrated circuit according to one or more embodiments.

Reducing the width of via 56 in relation to the pitch between line 54a and unavailable lines 64, increases the separation distance between via 56 and unavailable lines 64 so that unavailable lines 64 can be routed similar to lines 54a and 54b. FIG. 2 depicts an embodiment having a via size sufficiently small to be able to route lines in a neighboring layer one level closer to the substrate with reduced risk of short circuits.

FIG. 2 is a side view of an interconnect structure 100 according to one or more embodiments. Interconnect structure 100 is over a substrate (not shown). Interconnect structure 100 includes vias 102, lines 104, vias 106, lines 108, vias 110 and lines 112. Line 104 is closer to the substrate than lines 108 and 112. Vias 102 are positioned below and in electrical connection with line 104. Vias 106 are positioned between lines 104 and 108 and are configured to provide electrically connection between lines 104 and 108. Vias 110 are positioned between lines 108 and 112 and are configured to provide electrical connection between lines 108 and 112. A dielectric material 130 is disposed around vias 102, 106 and 110 and lines 104, 108 and 112 and is configured to provide electrical isolation between each of vias 102, 106 and 110 and each of lines 104, 108 and 112. FIG. 2 depicts an order and a spacing of vias 102, 106 and 110 and lines 104, 108 and 112, but does not depict the directional orientation of vias 102, 106 and 110 and lines 104, 108 and 112.

Each grouping of lines and vias contacting a bottom surface of the lines is called a layer. A grouping of vias 102 and lines 104 is called a bottom layer 120. A grouping of vias 106 and lines 108 is called a transition layer 122. A grouping of vias 110 and lines 112 is called a top layer 124. In the embodiment of FIG. 2, interconnect structure 100 has one bottom layer 120 and one top layer 124. In some embodiments, interconnect structure 100 includes multiple bottom layers. In some embodiments, interconnect structure 100 includes multiple top layers.

In this application, a transition layer refers to the group of lines and vias connecting two different pitches of metal lines. In the embodiment of FIG. 2, transition layer 122 comprises lines 108 and vias 106.

Lines 104 in bottom layer 120 are separated by a first pitch, $P_1$. Lines 108 in transition layer 122 are separated by a second pitch, $P_2$. Lines 112 in top layer 124 are separated by the second pitch, $P_2$.

In some embodiments, vias 102, 106 and 110 and lines 104, 108 and 112 independently comprise copper, aluminum, gold, tungsten, tantalum nitride, titanium nitride, alloys, or other suitable conductive materials. In some embodiments, vias 102, 106 and 110 and lines 104, 108 and 112 have the same composition. In some embodiments, vias 102, 106 and 110 and lines 104, 108 and 112 independently have different compositions.

In some embodiments, dielectric 130 comprises silicon dioxide. In some embodiments, dielectric 130 comprises a low k dielectric material. A low k dielectric material is a material where the dielectric constant, k, is less than 3.5. Low k dielectric materials include fluorine-doped silicon dioxide, carbon-doped silicon dioxide, aerogel, or other suitable dielectric materials.

In some embodiments, vias 102, 106 and 110 have a circular cross section. In some embodiments, vias 102, 106 and 110 have a rectangular cross section or another suitably shaped cross section. In some embodiments, at least one of vias 102, 106 or 110 has a different cross sectional shape than at least another of vias 102, 106 or 110.

In some circular cross section embodiments, vias 102 have a diameter ranging from 30 nm to 36 nm and vias 110 have a diameter ranging from 40 nm to 50 nm. In some embodiments, vias 106 have a smaller diameter than vias 110. In some embodiments, vias 106 have a diameter substantially the same as vias 102. In some embodiments, vias 106 have a diameter substantially different than vias 102. In some embodiments, vias 106 have a diameter ranging from the diameter of vias 102 to two times the diameter of vias 102.

In some rectangular cross section embodiments, vias 102 have a width and a length ranging from 30 nm to 36 nm and vias 110 have a width and a length ranging from 40 nm to 50 nm. In some embodiments, vias 106 have a smaller width and a smaller length than vias 110. In some embodiments, vias 106 have a width and a length substantially the same as vias 102. In some embodiments, vias 106 have a width and a length substantially different than vias 102. In some embodiments, vias 106 have a width ranging from the width of vias 102 to two times the width of vias 102.

In some embodiments, a cross sectional area of vias 102 ranges from 750 nm$^2$ to 1100 nm$^2$. In some embodiments, a cross sectional area of vias 106 ranges from 750 nm$^2$ to 1100 nm$^2$. In some embodiments, the cross sectional area of vias 110 is at least 30% larger than the cross sectional area of vias 102. In some embodiments, the cross sectional area of vias 110 is at least 30% larger than the cross sectional area of vias 106. In some embodiments, vias 106 have a cross section area ranging from the cross sectional area of vias 102 to four times the cross sectional area of vias 102.

In embodiments having other cross sectional shapes, vias 102, 106 and 110 have substantially similar cross sectional areas as the circular or rectangular embodiments.

In some embodiments, lines 104, 108 and 112 are elongated rectangular shapes. In some embodiments, lines 104, 108 and 112 have a cylindrical shape or other suitable shape. In some embodiments, at least one of lines 104, 108 and 112 has a different shape than at least another of lines 104, 108 and 112.

In some embodiments, the first pitch, P1, between lines 104 of bottom layer 120 ranges from 60 nm to 68 nm. In some embodiments, the second pitch, P2, between lines 108 of transition layer 122 ranges from the first pitch, P1, of lines 104 to two times the first pitch, P1, of lines 104.

In some instances, vias 106 lack sufficient mechanical strength to support lines 108 due to the relative size of vias 106 and lines 108. To avoid damage to vias 106 and failure of the electrical connections of the interconnect structure, lines 108 in the transition layer 122 have a reduced thickness in comparison with lines 112 in top layer 124. The reduced size of lines 108 in transistor layer 122 increases the resistance of lines 108 and potentially reduces a speed of a circuit. In some embodiments, signals along a critical path, i.e., a path whose speed determines an overall circuit speed, are transmitted along lines in a layer further from the substrate than lines 108. In some embodiments, lines 108 along the critical path are wider than other lines 108 not along the critical path. In some embodiments, signals along the critical path are split between more than one of lines 108.

In some embodiments, lines 104 have a thickness ranging from 50 nm to 150 nm. In some embodiments, a thickness of lines 108 ranges from the thickness of lines 104 to two times the thickness of lines 104. In some embodiments, lines 112 are thicker than lines 108. In some embodiments, lines 112 are at least 25% thicker than lines 108. In some embodiments, the thickness of lines 108 is less than the thickness of lines 112 and greater than the thickness of lines 104.

In the embodiment of FIG. 2, lines 104, 108 and 112 have a width ranging from 50 nm to 150 nm.

Figure 3:
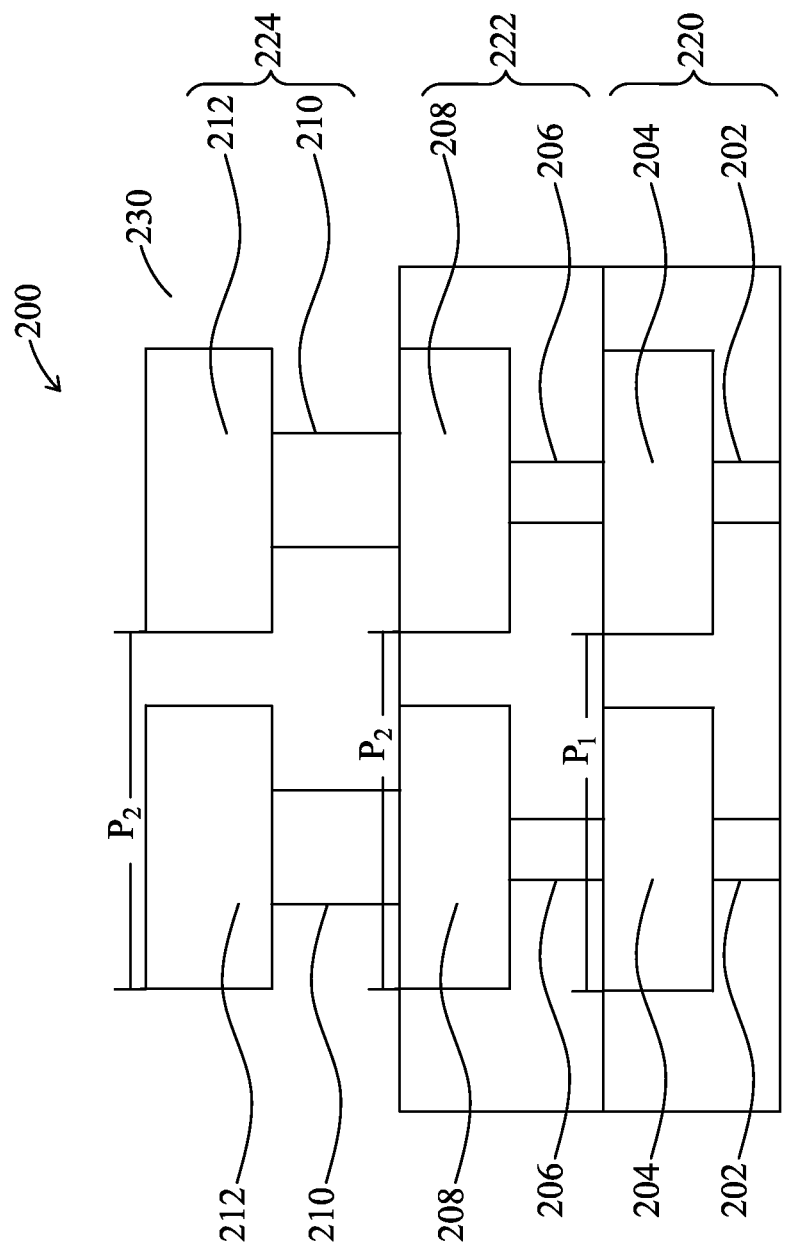
FIG. 3 is a side view of an interconnect structure for a high speed integrated circuit according to one or more embodiments.

FIG. 3 is a side view of a high speed interconnect structure 200 according to one or more embodiments. Interconnect structure 200 is over a substrate (not shown). Interconnect structure 200 includes vias 202, lines 204, vias, 206, lines 208, vias 210 and lines 212. Lines 204 are closer to the substrate than lines 208 or lines 212. Vias 202 are positioned below and in electrical connection with line 204. Vias 206 are positioned between lines 204 and 208 and are configured to provide electrically connection between lines 204 and 208. Vias 210 are positioned between lines 208 and 212 and are configured to provide electrical connection between lines 208 and 212. A dielectric material 230 is disposed around vias 202, 206 and 210 and around lines 204, 208 and 212 and configured to provide electrical isolation. FIG. 3 depicts an order and a spacing of vias 202, 206 and 210 and lines 204, 208 and 212, but does not depict the directional orientation of vias 202, 206 and 210 and lines 204, 208 and 212.

The groupings and materials of interconnect structure 200 are substantially the same as interconnect structure 100 (FIG. 2). Interconnect structure 200 also includes via shapes, via dimensions, line shapes, pitch, and line thickness which are substantially the same as interconnect structure 100. However, a width of lines 204, 208 and 212 is different than the width of lines 104, 108 and 112.

In some embodiments, lines 204 have a width ranging from 100 nm to 200 nm. In some embodiments, a width of lines 108 ranges from the width of lines 104 to two times the width of lines 104. In some embodiments, lines 112 are wider than lines 108. In some embodiments, a width of lines 108 is less than a width of lines 112 and greater than the width of lines 104. The larger width of lines 204, 208 and 212 provides reduced resistance in comparison with lines 104, 108 and 112, thereby allowing higher current and faster charge conveyance.

In some integrated circuit (IC) designs, the IC has high speed regions and standard speed regions, the high speed regions transfer signals at a higher speed than standard speed regions. In some embodiments, interconnect structure 200 having wider lines 204, 208 and 212 is configured to connect to the high speed regions of the IC, while interconnect structure 100 is configured to connect to the standard speed regions of the IC.

Figure 4:
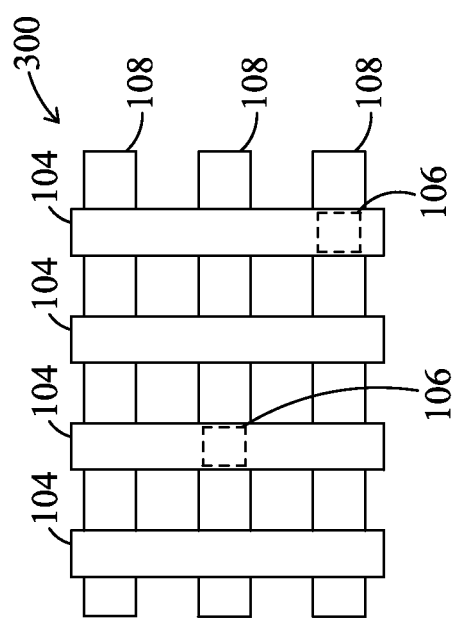
FIG. 4 is a bottom view of a portion of the interconnect structure of FIG. 1 according to one or more embodiments.

FIG. 4 is a bottom view of interconnect structure 300. FIG. 4 depicts lines 104 extending substantially perpendicular to lines 108. FIG. 4 further depicts vias 106, as a dashed line, positioned in some locations where lines 108 pass directly above lines 104. Vias 106 extend between lines 104 and 108 to provide electrical connection between lines 104 and 108. FIG. 4 depicts two vias 106. In some embodiments, vias 106 are located in at least one position where lines 108 pass directly above lines 104. In some embodiments, vias 106 are located at every position where lines 108 pass directly above lines 104.

To reduce the chance of forming a short circuit, the spacing between vias 106 in transition layer 122 and lines 104 in bottom layer 120 must be above a certain threshold value. The threshold value is determined based on materials in interconnection structure 100 and voltage passing through lines 104 and vias 106.

In contrast to the conventional interconnect structure 50 (FIG. 1), interconnect structure 300 has a width of vias 106 sufficiently small to permit placement of lines 104 with constant pitch while avoiding the need to omit any of lines 104. In instances, where the size of vias 106 is not sufficiently small, in order to avoid an increase in the likelihood of short circuits, certain lines 104 are omitted to maintain sufficient spacing between vias 106 and lines 104.

When lines 104 are omitted, an area of interconnect structure 100 is increased to provide the same level of functionality. The increased area of the interconnect structure 100 requires a larger overall circuit size. By forming vias 106 having sufficiently small size, the usable area of interconnect structure 300 can be increased up to about 12% over interconnect structures lacking sufficiently small vias in the transition layer. Limiting the number of bottom layers 120 between the transition layer 122 and the substrate helps to maximize the increase in usable area.

The reduced size of vias 106 requires greater precision in the forming of vias 106 because an acceptable range misalignment error between vias 106 and lines 108 is reduced as a result of the decreased cross sectional area of vias 106. In order to reduce misalignment error, an overlay error sampling rate is increased. The overlay error measures an offset between a position of a mask used in a photolithography process and an actual pattern transferred from the mask to the wafer. The increased overlay sampling rate means an interval between wafers tested during a production process is decreased.

One aspect of the description relates to an interconnect structure including a bottom layer over a substrate, where the bottom layer includes at least one bottom layer line and at least one bottom layer via; a transition layer over the bottom layer, where the transition layer includes at least one transition layer line and at least one transition layer via; and a top layer over the transition layer, where the top layer includes at least one top layer line and at least one top layer via, where the at least one transition layer via has a cross sectional area at least 30% less than a cross sectional area of the at least one top layer via.

Another aspect of the description relates to an integrated circuit including a first interconnect structure including a first bottom layer over a substrate, where the first bottom layer includes at least one first bottom layer line and at least one first bottom layer via, a first transition layer over the first bottom layer, where the first transition layer includes at least one first transition layer line and at least one first transition layer via, and a first top layer over the first transition layer, where the first top layer includes at least one first top layer line and at least one first top layer via, where the at least one first transition layer via has a cross sectional area at least 30% less than a cross sectional area of the at least one first top layer via; and a second interconnect structure including a second bottom layer over the substrate, where the second bottom layer includes at least one second bottom layer line and at least one second bottom layer via, a second transition layer over the second bottom layer, where the second transition layer includes at least one second transition layer line and at least one second transition layer via, and a second top layer over the second transition layer, where the second top layer includes at least one second top layer line and at least one second top layer via, where the at least one second transition layer via has a cross sectional area at least 30% less than a cross sectional area of the at least one second top layer via, where a width of the at least one first transition layer line is less than a width of the at least one second transition layer line.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit comprising:
   a first interconnect structure comprising
      a first bottom layer over a substrate, wherein the first bottom layer comprises a first bottom layer line and a first bottom layer via,
      a first transition layer over the first bottom layer, wherein the first transition layer comprises a first transition layer line and a first transition layer via, and the first transition layer via is physically connected to the first transition layer line, and
      a first top layer over the transition layer, wherein the first top layer comprises a first top layer line and a first top layer via; and
   a second interconnect structure comprising
      a second bottom layer over the substrate, wherein the second bottom layer comprises a second bottom layer line and a second bottom layer via,
      a second transition layer over the second bottom layer, wherein the second transition layer comprises a second transition layer line and a second transition layer via, and the second transition layer via is physically connected to the second transition layer line, and
      a second top layer over the transition layer, wherein the second top layer comprises a second top layer line and a second top layer via,
   wherein a width of the first transition layer line is less than a width of the second transition layer line, and a pitch between the first transition layer line and the second transition layer line is greater than a pitch between the first transition layer via and the second transition layer via.

2. The integrated circuit of claim 1, wherein the at least one first transition layer line has a thickness at least 25% lower than a thickness of the at least one first top layer line, and the at least one second transition layer line has a thickness at least 25% lower than a thickness of the at least one second top layer line.

3. An integrated circuit comprising:
   a first interconnect structure comprising a first bottom layer over a substrate, wherein the first bottom layer comprises a first bottom layer line and a first bottom layer via, a first transition layer over the first bottom layer, wherein the first transition layer comprises a first transition layer line and a first transition layer via, and the first transition layer via is in direct contact with the first transition layer line, and a first top layer over the transition layer, wherein the first top layer comprises a first top layer line and a first top layer via; and a second interconnect structure comprising a second bottom layer over the substrate, wherein the second bottom layer comprises a second bottom layer line and a second bottom layer via, a second transition layer over the second bottom layer, wherein the second transition layer comprises a second transition layer line and a second transition layer via, and the second transition layer via is in direct contact with the second transition layer line, and a second top layer over the transition layer, wherein the second top layer comprises a second top layer line and a second top layer via, wherein a pitch between the first transition layer line and the second transition layer line is different from a pitch between the first transition layer via and the second transition layer via, and a cross sectional area of the second transition layer via is substantially equal to a cross sectional area of the second bottom layer via.

4. The integrated circuit of claim 1, wherein a thickness of the at least one first bottom layer line is less than a thickness of the at least one first transition layer line, the thickness of the at least one first transition layer line is less than a thickness of the at least one first top layer line, a thickness of the at least one second bottom layer line is less than a thickness of the at least one second transition layer line, and the thickness of the at least one second transition layer line is less than a thickness of the at least one second top layer line.

5. The integrated circuit of claim 1, wherein the cross sectional area of the first transition layer via and the second transition layer via range from 700 $nm^2$ to 1100 $nm^2$.

6. The integrated circuit of claim 1, wherein a thickness of the first transition layer line and the second transition layer line range from 50 nm to 150 nm.

7. The integrated circuit of claim 1, wherein a pitch between the first transition layer line and the second transition layer line ranges from 85 nm to 95 nm, and a pitch between the first bottom layer line and the second bottom layer line ranges from 60 nm to 70 nm.

8. The integrated circuit of claim 1, wherein a pitch between the first transition layer line and the second transition layer line is substantially equal to a pitch between the first top layer line and the second top layer line.

9. The integrated circuit of claim 1, wherein the width of the first transition layer line ranges from 50 nm to 150 nm.

10. The integrated circuit of claim 1, wherein the width of the second transition layer line ranges from 150 nm to 300 nm.

\* \* \* \* \*